United States Patent [19]
Bolte et al.

[11] Patent Number: 5,464,494
[45] Date of Patent: Nov. 7, 1995

[54] DISPERSION-BASED HEAT-SEALABLE COATING

[75] Inventors: Gerd Bolte, Monheim; Guenter Henke, Neuss; Ulrike Brueninghaus, Erkrath, all of Germany

[73] Assignee: Henkel Kommanditgesellschaft auf Aktien, Duesseldorf, Germany

[21] Appl. No.: 240,751

[22] PCT Filed: Nov. 6, 1992

[86] PCT No.: PCT/EP92/02553

§ 371 Date: May 10, 1994

§ 102(e) Date: May 10, 1994

[87] PCT Pub. No.: WO93/10202

PCT Pub. Date: May 27, 1993

[30] Foreign Application Priority Data

Nov. 15, 1991 [DE] Germany ............... 41 37 512.2

[51] Int. Cl.$^6$ ............... C09J 5/06; C09J 135/02; C09J 163/02
[52] U.S. Cl. ............... 156/330; 156/331.7; 156/332; 523/411; 523/412; 525/109; 525/111
[58] Field of Search ............... 523/812, 411; 525/109, 111; 156/330, 331.7, 332

[56] References Cited

U.S. PATENT DOCUMENTS

| | | | |
|---|---|---|---|
| 3,971,745 | 7/1976 | Carlson et al. | 260/29.2 |
| 4,278,578 | 7/1981 | Carpenter | 428/423.3 |
| 4,581,395 | 4/1986 | Nakaya et al. | 523/412 |
| 4,772,643 | 9/1988 | Ernst et al. | 523/59 |

FOREIGN PATENT DOCUMENTS

| | | |
|---|---|---|
| 0201715 | 7/1986 | European Pat. Off. . |
| 3247756 | 6/1984 | Germany . |
| 60-118781 | 6/1985 | Japan . |
| 60-118781 | 6/1985 | Japan . |
| 62-112676 | 5/1987 | Japan . |
| 62-153371 | 7/1987 | Japan . |
| 9006330 | 7/1990 | WIPO . |
| 9118071 | 11/1991 | WIPO . |

OTHER PUBLICATIONS

Encyclopedia of Clymer Science & Engineering, 1985, pp. 550, 566 & 568.
Ullmann, Enzyklopaedie ter technischen Chemie, 4th Edition, vol. 10, Verlag Chemie, Weinheim/Bergstrasse 1974, pp. 563 et seq.
Ullmann, Enzyklopaedie ter technischen Chemie, 4th Edition vol. 19, pp. 11–21, pp. 132 et seq. and pp. 370–373.
Encyclopedia of Ploymer Science and Engineering, vol. 6, Wiley & Sons, New York, N.Y., 1986, pp. 1–51.

*Primary Examiner*—Melvyn I. Marquis
*Assistant Examiner*—D. Aylward
*Attorney, Agent, or Firm*—Wayne C. Jaeschke; John D. Wood; Daniek S. Ortiz

[57] ABSTRACT

Film-forming reactive systems for the surface-to-surface bonding and/or coating of substrates, more particularly for heat-sealable coatings are provided. The system is based on an aqueous dispersion of at least two epoxy-curable resins (I) and an epoxy compound as the curing component (II). The epoxy-curable resins are a polyurethane polymer containing epoxy-reactive functional groups present as the curable resin (Ia) and an aqueous dispersion of an acrylate and/or methacrylate homopolymer or copolymer containing carboxyl and/or methylol groups present as an additional curable resin (Ib). Also provided is a method for the production of laminates which employs the reactive system to bond substrates.

30 Claims, No Drawings

DISPERSION-BASED HEAT-SEALABLE COATING

BACKGROUND OF THE INVENTION

1. Field of the Invention

This invention relates to two-component, film-forming reactive systems for the surface-to-surface bonding and/or coating of substrates, more particularly for heat-sealable coatings, based on aqueous dispersions of at least one epoxy-curable resin (I) and epoxy compounds as curing agent (II)

and to their use. The invention also relates to a process for the production of composites and adhesive-coated substrates.

2. Discussion of Related Art

The production of laminates and composites and especially the production of base materials for flexible printed circuits requires special adhesive systems. The requirements which such systems have to meet are very stringent because on the one hand materials difficult to bond, such as for example copper foils to polyimide films, have to be bonded and because, on the other hand, the composite materials obtained have to be flexible and highly resistant to heat. Solvent-containing adhesive systems based on modified polyurethane, polyester, acrylate and epoxy resins are known to the expert for such purposes. Besides the basic problems of solvents, systems of this type are often attended by the disadvantage that the cure times are far too long, for example up to 14 days in the case of polyurethane adhesive systems, or the curing temperatures are too high, for example up to 240° C. in the case of epoxy resin or acrylate systems. To eliminate the problems posed by solvents, water-based systems have been developed. Thus, water-based adhesives for flexible printed circuits containing dispersions of acrylate (co)polymers and epoxy compounds are known from JP 87/153371 and from JP 85/118781. A major disadvantage of systems such as these are the relatively long cure times, for example 16 hours at 130° C. in the case of JP 87/153371. JP 87/112676 describes water-containing polyurethane adhesives based on polyurethane dispersions (A) obtained from polytetramethylene glycol (MW 400 to 2,000), an organic diisocyanate and a dimethylol carboxylic acid and also hydrazine or dihydrazides as chain extenders neutralized with tertiary amines and a water-soluble compound (B) containing two or more epoxy or aziridine rings per molecule. Although it is stated by way of example that various films, for example PET and polypropylene, can be bonded to one another with this adhesive, there is nothing in the document in question to suggest to the expert that adhesives of the type in question could be suitable for heat-sealable coatings. In addition, there are no references to the production of non-blocking coatings or to the use of the adhesives for the production of flexible printed circuits.

The problem addressed by the present invention was to provide water-based reactive systems which would be capable of developing high bond strengths, even on substrates which are difficult to bond, such as polyimides. In addition, high flexibility, high insulation resistance, high heat resistance and good solder bath resistance would all be guaranteed. The cure time would be relatively short while the curing temperature would be below 200° C. In addition, the particular requirement of blocking resistance would be satisfied. By this is meant the non-tackiness of a film at typical ambient temperatures and storage temperatures which is obtained by coating a substrate with the reactive system according to the invention and subsequent drying. In addition, a new raw material base and a different class of polymers would be opened up as starting material for systems of the type in question.

SUMMARY OF THE INVENTION

According to the invention, the problem stated above has been solved by two-component, film-forming reactive systems for the surface-to-surface bonding and/or coating of substrates, more particularly for heat-sealable coatings, based on aqueous dispersions of at least one epoxy-curable resin (I) and epoxy compounds as curing agent (II), characterized in that polyurethane polymers containing functional groups reactive to epoxy compounds and, if desired, other resins are present as the curable resin (Ia).

DETAILED DESCRIPTION OF THE INVENTION

Accordingly, the two-component reactive system according to the invention contains dispersions of an epoxy-curable resin (I) and dispersed epoxy compounds as the curing agent (II). In contrast to the two Japanese applications cited above, the curable resin (Ia) present in (I) consists of polyurethane polymers containing functional groups reactive to epoxy compounds. Amino groups, carboxyl groups and/or hydroxyl groups are particularly suitable as the reactive functional groups, carboxyl groups being preferred. Polyurethane polymers modified in this way are known to the expert.

Basically, there are a large number of starting materials which are suitable for the production of polyurethanes. In approximate terms, they may be divided into the so-called polyol component and the so-called isocyanate component. Among the polyols, polyester polyols, polyether polyols and polyester polyether polyols are particularly important. Polyurethanes based on polyester polyols are preferred for the purposes of the invention. They are generally obtained by reaction of polyhydric alcohols with polybasic carboxylic acids. Suitable isocyanates for the production of polyurethanes are, for example, aliphatic, aromatic and/or alicyclic polyfunctional isocyanates. 4,4'-Diphenylmethane diisocyanate (MDI), isophorone diisocyanate (IPDI), tolylene diisocyanate (TDI) and tetramethyl xylene diisocyanate (TMXDI) are mentioned as examples. Further examples of the broad range of suitable polyol and isocyanate components can be found in the relevant specialist and patent literature on polyurethanes, for example in published European patent application 354 471. The chain-extending step mentioned in that document is also possible. However, for the reasons of physiological compatibility mentioned in the document in question, the chain-extending agents used should not be physiologically problematical such as, for example, hydrazine, diamino-diphenyl methane or the isomers of phenyldiamine and the carbohydrazides or hydrazides of dicarboxylic acids.

The introduction of the epoxy-reactive functional groups into the polymer chain is also known in principle to the expert. For example, hydroxyfunctional polyurethanes can be obtained by selecting a ratio of OH groups to NCO groups of greater than 1 for the reaction of the polyol and isocyanate components. Carboxyl groups can be introduced, for example, by adding one part of dihydroxy carboxylic acid to the polyol component before it is reacted with the isocyanate component. Suitable amino-functional polyurethanes can be obtained, for example, by reaction of isocyanate-containing polyurethanes with polyfunctional amino compounds providing the isocyanate group is present in less than the equivalent quantity. Further information on the introduction of such functional groups, more particularly the carboxyl groups particularly preferred for the purposes of the invention, can also be found in the published European patent application cited above.

Suitable polyurethane polymers may also contain different epoxy-reactive groups. However, those in which the sum total of the acid value, OH value and amine value is on average 0.1 to 40 are also suitable. Polyurethane polymers in which the sum total mentioned is between 0.3 and 20 are particularly suitable. A range of 0.5 to 5 is preferred. Basically, polyurethanes containing at least an average of two epoxy-reactive functional groups are preferred for the purposes of the invention. Among such polymers, those in which these reactive groups are terminally positioned are particularly suitable. So far as performance properties, particularly flexibility and bond strength, are concerned, polyurethanes with an average molecular weight of from about 7,000 to 50,000 are preferably used. Particularly good results are obtained with polyurethanes having an average molecular weight in the range from 10,000 to 30,000. Both here and in the following, the average molecular weight is understood to be the weight average.

Suitable epoxy compounds are known to the expert both from the patent literature and from encyclopedias. For example, the production, properties and use of epoxy compounds are described in detail in Ullmann, Enzyklopädie der technischen Chemie, 4th Edition, Vol. 10, Verlag Chemie, Weinheim/Bergstrasse 1974, pages 563 et seq. Commercially the most important epoxy compounds include those based on bisphenol A and/or novolak. Besides these, heterocyclic epoxy compounds are also particularly suitable. According to the invention, epoxy resin dispersions are used. In principle, any dispersible epoxy resins are suitable. This applies both to the emulsifier-containing dispersions and to corresponding self-emulsifying systems. Such epoxy compounds as triglycidyl isocyanurate, polyethylene glycol diglycidyl ether or sorbitol polyglycidyl ether are also suitable. Instead of the dispersible epoxy resins, water-soluble epoxy compounds may also be completely or partly used. The epoxy compounds suitable for use in accordance with the invention preferably contain an average of at least two epoxy groups. Epoxy compounds with an epoxy equivalent of 100 to 4,000 are particularly preferred. An epoxy equivalent is understood to be the quantity in grams present in 1 mole of epoxy compound. Particularly good results are obtained with epoxy compounds in which this value is between 150 and 600.

In one preferred embodiment of the invention, the dispersion of an epoxy-curable resin (I) contains acrylate and/or methacrylate homopolymers or copolymers with carboxyl and/or methylol groups in dispersed form as a further curable resin (Ib) in addition to the polyurethanes (Ia) already described. (Meth)acrylate polymers modified in this way are known to the expert. Acrylic acid and methacrylic acid and also salts and esters thereof are mentioned as examples of suitable (meth)acrylates for the production of such polymers. The alcohol component of these esters preferably contains 1 to 6 carbon atoms. So far as the polymer dispersions or emulsion used in accordance with the invention are concerned, the expert will usefully resort to those which have been produced by emulsion polymerization. The monomers mentioned may of course also be (co)polymerized with other ethylenically unsaturated monomers providing they are copolymerizable. Suitable monomers such as these are any of those containing ethylenically unsaturated or vinyl groups.

The vinyl compounds include, for example, vinyl chloride and vinyl esters, such as vinyl acetate, vinyl propionate, and even vinyl fatty acid esters, such as vinyl laurate, and also vinyl alcohol. Suitable styrene compounds are styrene, halostyrenes, such as chlorostyrene, fluorostyrene and iodostyrene; alkyl styrenes, such as methyl styrene and 2,4-diethyl styrene, cyanostyrenes, hydroxystyrenes, nitrostyrenes, aminostyrenes and/or phenyl styrenes. Suitable derivatives of the acrylic compounds also include acrylonitrile for example. The carboxyl groups present in accordance with the invention in the polymers described above may be introduced, for example, by using acrylic acid and/or methacrylic acid as monomers in the polymerization reaction. Methylol groups are obtained, for example, by the use of hydroxystyrenes or by copolymerization of vinyl acetate and subsequent saponification.

As already mentioned, it has long been known to the expert that monomers of the type in question can be added to form polymers in an aqueous medium under emulsion polymerization conditions, as described for example in Ullmann, loc. cit., Vol. 19, pages 11–21, pages 132 et seq. and pages 370–373 and in Encyclopedia of Polymer Science and Engineering, Volume 6, Wiley & Sons, New York, 1986, pages 1 to 51. Suitable monomers include, for example, vinyl compounds, the acrylates already mentioned and corresponding derivatives.

Polymers suitable for the purposes of the invention are, for example, (meth)acryl/styrene/acrylonitrile copolymers or polybutyl methacrylate. Homopolymers of acrylic acid and methacrylic acid are also suitable. The polymers mentioned above are particularly preferred when they have an average molecular weight of 50,000 to 300,000. Homopolymers and copolymers in which the sum total of acid value and OH value is between 1 and 40 are preferred for the purposes of the invention. Particularly good results are obtained with the polymers mentioned when the sum total in question is between 3 and 15, but more particularly between 4 and 10.

The ratio of the curable resins is of particular importance in regard to performance results. According to the invention, the ratio by weight of the curable resin (Ia) to resin (Ib) is in the range from 100:0 to 5:95. As a general rule, it may be said that, the larger the polyurethane component, the more flexible the film formed from the reactive system whereas, the higher the percentage of the other curable resin, the higher the heat resistance value will be. Even a relatively small percentage of (Ib) leads to distinctly improved values in regard to the last-mentioned property. Accordingly, the preferred range is between 99:1 and 25:75. A particularly optimal and, hence, preferred ratio of (Ia) to (Ib) is 98:2 to 50:50. The ratios mentioned are based on the solids content of the dispersion.

The ratio of curable resin (I) to curing agent (II) is also of particular importance. The ratios of the individual components to one another and the specification of these components do of course interact with one another in influencing the performance properties of the reactive systems according to the invention or rather the films formed from them. Thus, reactive systems with a broad range of performance properties can be formulated via the ratio between the quantities of individual components, their molecular weights and their functionalities. Thus, formulations with high initial tack and formulations which give a particularly blocking-resistant coating can be produced. Accordingly, the ratio by weight of resin (I) to curing agent (II) can vary over a preferred range of 1:5 to 10:1. A range of 1:1 to 5:1, in which optimal results are obtained, is particularly preferred.

To enable the curing process to be carried out in two stages, namely at room temperature and at elevated temperature, and to promote the formation of a so-called interpenetrating network (IPN), the dispersion should contain either 2 to 15% by weight, based on the solids content, of a polyaziridine or 2 to 30% by weight, based on the solids content, of a phenol/resol resin in addition to components (I) and (II) in a preferred embodiment of the invention.

The polyaziridine is a polyfunctional aziridine corresponding to the following general formula:

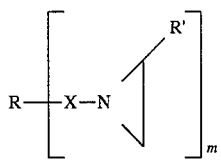

in which
R is n organic aliphatic radical or a hydrogen atom,
X is an alkylene group which may contain an ester group, an ether group, an amide group or a similar inert group,
R' is an alkyl group containing 1 to 10 carbon atoms and
m is a number of 2 to 4.

It may be prepared in known manner by reaction of alkyl aziridines with compounds containing NH-reactive groups. Preferred polyaziridines are those in which R' is methyl, ethyl, propyl, butyl,

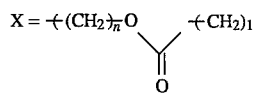

where n=1 to 3, l=1 to 3, and
m is a number of 2 to 3 and R is a $CH_3$—$CH_2$—C radical.
The addition of the polyaziridine results in:
  an improvement in adhesion at lamination temperatures between room temperature and 90° C.,
  accelerated curing at room temperature,
  an improvement in heat resistance and resistance to chemicals where curing is carried out at room temperature.

The phenol/resol resin is also a known product and is obtained by condensation of phenols, cresols and the like with formaldehyde. Liquid phenol resols are preferred. Their addition produces a further improvement in the heat resistance of the adhesive film.

In one particular embodiment of the invention, the reactive systems may also contain typical additives in a total quantity of up to 30% by weight, based on the total solids content of the reactive system, in addition to the dispersions of resin (I) and curing agent (II). Examples of a few typical additives are given in the following. Catalysts such as, for example, tertiary amines or phosphoric acid or derivatives thereof may be present, preferably in a quantity of up to 1% by weight. Coupling agents, such as silanes, titanates and zirconates, may be present in a quantity of up to 1% by weight. In order to keep the surface open for a long period during film formation, high-boiling solvents may be added in a quantity of up to 5% by weight. Foam inhibitors and wetting aids are typically present in quantities of up to 2% by weight. Acid anhydrides or even styrene/maleic anhydride resins, for example, may be present as the crosslinking agent or wetting aid in a quantity of up to 10% by weight. A flexibilizer, for example NBR rubber with a molecular weight of 30,000 to 200,000, may be added in a quantity of up to 10% by weight for special applications. Polyesters with an average molecular weight of around 600 to 15,000 or even glycol ethers may be present as plasticizers in quantities of up to 5% by weight. Other possible additives are flameproofing agents, preservatives, etc. and effective quantities thereof are known to the expert from the literature and need not be mentioned here. The percentages by weight mentioned above are again based on the total solids content of the reactive system which is preferably in the range from 30% by weight to 75% by weight and more preferably in the range from 40% by weight to 65% by weight.

Using the reactive systems according to the invention, it is possible to produce adhesive-coated substrates which are suitable, for example, for the production of flexible printed circuits. To this end, the reactive system is applied to the substrate, for example a metal foil, such as copper foil, after thorough mixing of the dispersions of the resins (I) and the curing agent (II). This can be done by roller coating, spray coating, spread coating, knife coating or dip coating. The reactive system is generally applied in a layer thickness of 15 to 40 µm and preferably in a layer thickness of 20 to 25 µm. The substrate thus coated is then dried at a temperature below the reactivation temperature. Accordingly, the drying temperature should not exceed 120° C. to a significant extent, if at all. Drying may be carried out, for example, in standard drying tunnels. Using a standard drying tunnel 4 meters in length, the coating of films in accordance with the invention may be carried out at film speeds of 10 to 20 meters per minute, for example at temperatures of 120° C. and with a throughput of approximately 4,000 m³ of air per hour. The adhesive-coated substrate obtained in this way is blocking-resistant, i.e. is not tacky at normal storage temperatures and ambient temperatures.

Blocking-resistant systems such as these afford the advantage over the prior art that, for storage, the substrate does not have to be covered by an additional protective film on its coated side. Films coated in accordance with the invention may thus be stored in the form of rolls free from protective films or cover films. Accordingly, there is no protective film or cover film to be removed in the practical application of the coated substrates produced in accordance with the invention. Substrates thus coated in accordance with the invention may be used for the production of laminates or composites. To this end, they are subjected to hot pressing with another substrate. In other words, the adhesive-coated substrate is reactivated by heat and joined surface-to-surface to the other substrate by application of pressure, followed by curing. The pressure applied during the hot pressing step is dependent on the particular machine used and on the laminates or composites to be produced and is typically in the range from 5 to 200 bar. Establishment of the optimal pressure for the particular combination is within the scope of the expert's experience. Reactivation and curing preferably take place at temperatures in the range from 140° to 170° C. Another advantage of the invention lies in the short cure times of 30 to 60 minutes.

The reactive systems according to the invention may of course also be used for the in-line production of laminates or composites. This eliminates the need for intermediate storage and, instead, the substrates are joined surface-to-surface (in-line) immediately after coating, optionally after brief preliminary drying of the reactive system applied, and the reactive system is subsequently cured. Accordingly, there is no need for intermediate storage of the coated substrate (off-line process). Laminates or composites with more than two substrates which may consist of a variety of materials may of course be produced both by the in-line process and by the off-line process. For in-line lamination, the expert may select the ratio of resins (Ia) and (Ib) to one another and to the curing component—as already described—in such a way that the reactive system according to the invention has a slightly higher initial tack. Although this is often at the expense of blocking resistance, blocking resistance is not an important factor in the in-line process.

Accordingly, the reactive systems according to the invention are particularly suitable for the production of multiply composites and laminates. The substrates may be metal foils, plastic films, woven cloths, nonwovens, special papers and/or cardboard. Copper, aluminium, lead and constantan foils are mentioned as examples of metal foils. Particularly suitable plastic films are films based on polyethylene terephthalate (PETP), polyimide (PI), polycarbonate (PC), polyester ether ketone (PEEK) and so-called liquid crystal polymers (LCP). Woven cloths of PETP or polyamide (PA), for example, are also suitable substrates. Nonwovens of PETP or polyaramide may also be used. The special papers and cardboards are those based on polyaramide or presspahn.

Copper foils coated in accordance with the invention applied under heat and pressure to other flexible substrates, such as Kapton® or polyester film, as described above form composites which are suitable for the production of flexible printed circuits. The corresponding further processing of films provided with heat-sealable coatings is known as dry lamination.

After thermal curing, the reactive systems according to the invention form films which develop high mechanical, thermal and chemical stability in the laminates or composites mentioned. In addition to the production of high-temperature-resistant, flexible printed circuits, the reactive systems according to the invention may also be used for the production of high-temperature-resistant insulating materials. In the present context, insulating materials are understood above all to be cable sheaths, cover films for circuits and coil windings.

The invention is illustrated by the following Examples.

EXAMPLES

Example 1

A water-based reactive system according to the invention contains in dispersed form
5 parts by weight of a carboxyfunctional polyester urethane with an average molecular weight of around 25,000 and an acid value of 0.7±0.3
5 parts by weight of a methacryl/styrene/acrylonitrile copolymer with an average molecular weight of around 200,000 and an acid value of 5.5±0.5 and
5 parts by weight of an epoxy resin based on bisphenol A with an epoxy equivalent weight of around 500.

After drying at around 120° C., the formulation mentioned above gives blocking-resistant films.

Example 2

A water-based reactive system according to the invention contains in dispersed form:
31 parts by weight of a carboxyfunctional polyurethane with an average molecular weight of around 25,000 and an acid value of 0.7±0.3
8 parts by weight of a carboxyfunctional polyurethane with an average molecular weight of around 10,000 and an acid value of 0.7±0.3
1 part by weight of a methacryl/styrene/acrylonitrile copolymer with an average molecular weight of around 200,000 and an acid value of 5.5±0.5
5 parts by weight of an epoxy resin based on bisphenol A with an epoxy equivalent of around 500 and
5 parts by weight of an epoxy resin based on bisphenol A with an epoxy equivalent of 170.

After drying, this reactive system gives a coating with high initial tack and is particularly suitable for in-line lamination.

The quantities in Examples 1 and 2 are based on the particular solids content.

Example 3

A reactive system according to Example 1 was applied to a 35 μm thick copper foil in a layer thickness of 20 to 25 μm. A 20 μm thick, compact non-blocking adhesive film was obtained after drying at 120° C.

Example 4

The coated copper foil according to Example 3 was laminated with a 23 μm thick polyethylene terephthalate film at 140° C. In the adhesion test, material failure occurred. In the heat resistance test, neither delamination nor bubble formation was observed after 1 day at 155° C. After tempering for 30 minutes at 170° C., a solder bath resistance of more than 45 seconds at 230° C. was observed.

Example 5

The coated copper foil according to Example 3 was laminated with a 50 μm thick Kapton® film at 170° C. In the adhesion test, material failure occurred. In the heat resistance test, no delamination or bubble formation was observed after 1 day at 220° C. After heating for 30 minutes at 170° C., a solder bath resistance of more than 60 seconds at 288° C. was observed.

Example 6

A polyester film was coated with the reactive system according to Example 1, dried and then laminated with a polyaramide film at 140° C. The adhesion test resulted in material failure. In the heat resistance test, there was no delamination or bubble formation after 1 day at 155° C.

Example 7

A polyester film was coated with the reactive system according to Example 1 and, after drying, was hot-pressed with a presspahn substrate. In this case, too, the adhesion test resulted in material failure. In the heat resistance test, no separation of the substrates nor any bubble formation occurred after 1 day at 130° C.

Example 8

The positive effect of polyaziridine is illustrated by the following Example:

A polyester film was coated with the reactive system according to Example 2, to which 5% of the polyaziridine CROSSLINKER CX-100 (a product of ICI), based on the solids content, had been added, dried and laminated in-line with polyaramide paper at around 60° C. The adhesion test resulted in material failure. In the heat resistance test, there was no delamination or bubble formation after 48 h at 55° C.

Example 9

The positive effect of a phenol/resol resin is illustrated by the following Example:
a) 2 Parts by weight of the polyurethane described in Example 1, 10 parts by weight of the acrylate copolymer described Example 1, 6 parts by weight of the epoxy resin described in Example 1 were mixed and the resulting mixture was applied to a copper foil and dried at 120° C.
b) 1 Part by weight of a liquid phenol resol resin was added to the mixture described above, after which the mixture was likewise applied to a copper foil and dried at 120° C. Both coatings were pressed for 1 h at 170° C. with 8 layers of a phenolic resin prepreg. Adhesive strengths of 4.2 to 4.5 N/3 mm were measured for sample a) and 4.6 to 4.9 N/3 mm for sample b). Sample a) had a solder bath resistance of 2 s at 260° C. while sample b) had a solder bath resistance of 22 s at 260° C.

We claim:

1. A composition of matter useful as a film-forming reactive system for the surface-to-surface bonding and/or coating of substrates, said composition comprising an aqueous dispersion comprised of:

a polyurethane polymer containing epoxy-reactive functional groups as a first curable resin, having a sum of an acid value, a hydroxyl value and an amine value of from 0.1 to 40, an acrylate and/or methacrylate homopolymer or copolymer containing carboxyl and/or methylol groups having a sum of an acid value and hydroxyl value from 1 to 40 is present in dispersed form as a second curable resin, an epoxy compound as a curing component for said first curable resin and said second curable resin.

2. A composition as claimed in claim 1 wherein the ratio by weight of said first curable resin to said second curable resin is at least 5:95.

3. A composition as claimed in claim 1 wherein the ratio by weight of said first curable resin to said second curable resin is in the range from 98:2 to 50:50.

4. A composition as claimed in claim 1 wherein the ratio by weight of the sum of the weights of said first curable resin and said second curable resin to said epoxy compound is in the range from 1:5 to 10:1.

5. A composition as claimed in claim 1 wherein the ratio by weight of the sum of the weights of said first curable resin and said second curable resin to said epoxy compound is in the range from 1:1 to 5:1.

6. A composition as claimed in claim 1 wherein the epoxy-reactive functional groups of said polyurethane polymer are carboxyl and/or hydroxyl groups.

7. A composition as claimed in claim 1 wherein the epoxy-reactive functional groups of said polyurethane polymer are carboxyl groups.

8. A composition as claimed in claim 1 wherein said polyurethane polymer has a weight average molecular weight of 7,000 to 50,000.

9. A composition as claimed in claim 1 wherein said polyurethane polymer has a weight average molecular weight of 10,000 to 30,000.

10. A composition as claimed in claim 1 wherein said polyurethane polymer contains at least an average of two epoxy-reactive functional groups.

11. A composition as claimed in claim 1 wherein the sum total of acid value, hydroxyl value and amine value of said polyurethane polymer is on average 0.3 and 20.

12. A composition as claimed in claim 1 wherein the sum total of acid value, hydroxyl value and amine value of said polyurethane polymer is on average 0.5 to 5.

13. A composition as claimed in claim 1 wherein said acrylate and/or methacrylate homopolymer and/or copolymer has a weight average molecular weight of 50,000 to 300,000.

14. A composition as claimed in claim 1 wherein said acrylate and/or methacrylate homopolymer and/or copolymer has a sum total of acid value and OH value of 3 to 15.

15. A composition as claimed in claim 1 wherein said acrylate and/or methacrylate homopolymer and/or copolymer has a sum total of acid value and OH value of 4 to 10.

16. A composition as claimed in claim 1 wherein said epoxy compounds have an epoxy equivalent of 100 to 4,000.

17. A composition as claimed in claim 1 wherein said epoxy compounds have an epoxy equivalent of 150 to 600.

18. A composition as claimed in claim 1 wherein said epoxy compounds are predominantly based on a member selected from the group consisting of bisphenol A, novolak and heterocyclic epoxy compounds.

19. A composition as claimed in claim 1 further comprising one or more additives selected from the group consisting of catalysts, coupling agents, solvents, wetting aids, foam inhibitors, and plasticizers, said additives being present in a total quantity of up to 30% by weight, based on the total solids content of said composition.

20. A composition as claimed in claim 1 further comprising a polyaziridine in an amount of 2% to 15% by weight, based on the solids content of said composition.

21. A composition as claimed in claim 1 further comprising a phenol/resol resin in an amount of 2% to 30% by weight, based on the solids content of said composition.

22. A composition of matter useful as a film-forming reactive system for the surface-to-surface bonding and/or coating of substrates, said composition comprising an aqueous dispersion comprised of:

a polyurethane polymer containing epoxy-reactive functional groups as a first curable resin, said polyurethane polymer having carboxyl groups as epoxy-reactive functional groups, a weight average molecular weight of 10,000 to 30,000, and the sum total of acid value, hydroxyl value and amine value of said polyurethane polymer is on average 0.5 to 5, an acrylate and/or methacrylate homopolymer or copolymer containing carboxyl and/or methylol groups is present in dispersed form as a second curable resin, said acrylate and/or methacrylate homopolymer or copolymer having a weight average molecular weight of 50,000 to 300,000 and a sum total of acid value and OH value of 4 to 10, wherein the ratio by weight of said first curable resin to said second curable resin is in the range from 98:2 to 50:50, an epoxy compound predominantly based on a member selected from the group consisting of bisphenol A, novolak and heterocyclic epoxy compounds, as a curing component for said first curable resin and said second curable resin, said epoxy compound having an epoxy equivalent of 150 to 600.

23. A process for the production of a substrate coated with a heat-reactivatable adhesive resistant to blocking at room temperature, said process comprising applying a composition as claimed in claim 1 to a substrate and then drying said composition at a maximum temperature of 120° C.

24. A process as claimed in claim 23 wherein said applying is by roll coating, spray coating, spread coating, knife coating or dip coating.

25. A process for the production of laminates, said process comprising joining surface-to-surface coated substrates produced by the process claimed in claim 23 to at least one other substrate by reactivation and subsequent curing of the coating at around 140° C. to 170° C.

26. A process as claimed in claim 25 wherein said laminates are multilayer laminates of metal foils, plastic films, woven cloths, nonwovens, special papers and/or cardboard.

27. A process as claimed in claim 25 wherein a copper foil is joined to a flexible substrate in the production of a high-temperature-resistant printed circuit.

28. A process for the production of laminates, said process comprising applying a composition as claimed in claim 1 to at least one of the substrates to be bonded, then immediately joining said substrates surface-to-surface, and curing said composition at about 140° C. to 170° C.

29. A process as claimed in claim 28 wherein said laminates are multilayer laminates of metal foils, plastic films, woven cloths, nonwovens, special papers and/or cardboard.

30. A process as claimed in claim 28 wherein a copper foil is joined to a flexible substrate in the production of a high-temperature-resistant printed circuit.

* * * * *